US 9,099,276 B1

(12) United States Patent
Muray et al.

(10) Patent No.: US 9,099,276 B1
(45) Date of Patent: Aug. 4, 2015

(54) HIGH-VOLTAGE ENERGY-DISPERSIVE SPECTROSCOPY USING A LOW-VOLTAGE SCANNING ELECTRON MICROSCOPE

(71) Applicant: Keysight Technologies, Inc., Minneapolis, MN (US)

(72) Inventors: Lawrence P. Muray, Moraga, CA (US); Scott W. Indermuehle, Danville, CA (US); James P. Spallas, San Ramon, CA (US); Ying Wu, Sunnyvale, CA (US); Dimitri Klyachko, Campbell, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 6 days.

(21) Appl. No.: 14/162,802

(22) Filed: Jan. 24, 2014

(51) Int. Cl.
*H01J 37/04* (2006.01)
*H01J 37/05* (2006.01)
*H01J 37/28* (2006.01)
*G01T 1/36* (2006.01)

(52) U.S. Cl.
CPC . *H01J 37/04* (2013.01); *G01T 1/36* (2013.01); *H01J 37/05* (2013.01); *H01J 37/28* (2013.01); *H01J 2237/002* (2013.01); *H01J 2237/0473* (2013.01); *H01J 2237/1205* (2013.01); *H01J 2237/2445* (2013.01); *H01J 2237/24485* (2013.01)

(58) Field of Classification Search
CPC ... H01J 2237/1205; H01J 37/04; H01J 37/28; H01J 2237/24485; H01J 2237/0473; H01J 2237/2445
See application file for complete search history.

(56) References Cited

U.S. PATENT DOCUMENTS

| 5,122,663 | A | 6/1992 | Chang et al. |
| 5,155,412 | A | 10/1992 | Chang et al. |
| 5,877,498 | A * | 3/1999 | Sugimoto et al. ............. 250/310 |
| 5,936,244 | A * | 8/1999 | Yajima et al. ................. 250/310 |
| 6,288,401 | B1 | 9/2001 | Chang et al. |
| 6,323,484 | B1 * | 11/2001 | Ide et al. ......................... 850/21 |
| 7,045,794 | B1 * | 5/2006 | Spallas et al. ............. 250/396 R |
| 7,109,486 | B1 | 9/2006 | Spallas et al. |
| 7,332,729 | B1 | 2/2008 | Muray et al. |
| 7,335,895 | B1 | 2/2008 | Spallas et al. |
| 8,003,952 | B2 | 8/2011 | Muray et al. |
| 8,106,358 | B2 | 1/2012 | Spallas et al. |
| 8,110,801 | B2 * | 2/2012 | Indermuehle et al. ........ 250/311 |
| 8,115,168 | B2 | 2/2012 | Muray et al. |
| 2001/0048075 | A1 * | 12/2001 | Frosien ......................... 250/307 |

(Continued)

OTHER PUBLICATIONS

Goldstein, et al., Scanning Electron Microscopy and X-ray Microanalysis, 3rd ed., Chapter 7 (Springer US 2003).

(Continued)

*Primary Examiner* — Michael Logie

(57) ABSTRACT

A scanning electron microscopy (SEM) and energy dispersive spectroscopy (EDS) apparatus that includes a scanning electron microscope, an x-ray detector, and an auxiliary acceleration voltage source. The scanning electron microscope includes a sample holder, and a layered electron beam column arranged to output an electron beam towards the sample holder at an initial beam energy. The auxiliary acceleration voltage source is to apply an auxiliary acceleration voltage between the sample holder and the layered electron beam column to accelerate the electron beam to a final beam energy. At the final beam energy, the electron beam is capable of generating x-rays at multiple wavelengths from a larger range of atomic species than the electron beam at the initial beam energy.

20 Claims, 8 Drawing Sheets

(56) References Cited

U.S. PATENT DOCUMENTS

| | | | |
|---|---|---|---|
| 2003/0118149 A1* | 6/2003 | Okuda et al. | 378/58 |
| 2008/0054180 A1* | 3/2008 | Silver et al. | 250/307 |
| 2010/0019166 A1* | 1/2010 | Kim et al. | 250/396 R |
| 2011/0240855 A1* | 10/2011 | Ohshima et al. | 250/310 |
| 2014/0117231 A1* | 5/2014 | Owen et al. | 250/307 |
| 2014/0284477 A1* | 9/2014 | Ebine et al. | 250/310 |

OTHER PUBLICATIONS

Muray, et al. "Advances in Arrayed Microcolumn Lithography," J. Vac. Sci. Technol. B, vol. 18, No. 6, Nov./Dec. 2000.

Chang, et al. "Multiple Electron-Beam Lithography," Microelectronic Engineering 57-58 (2001) pp. 117-135.

* cited by examiner

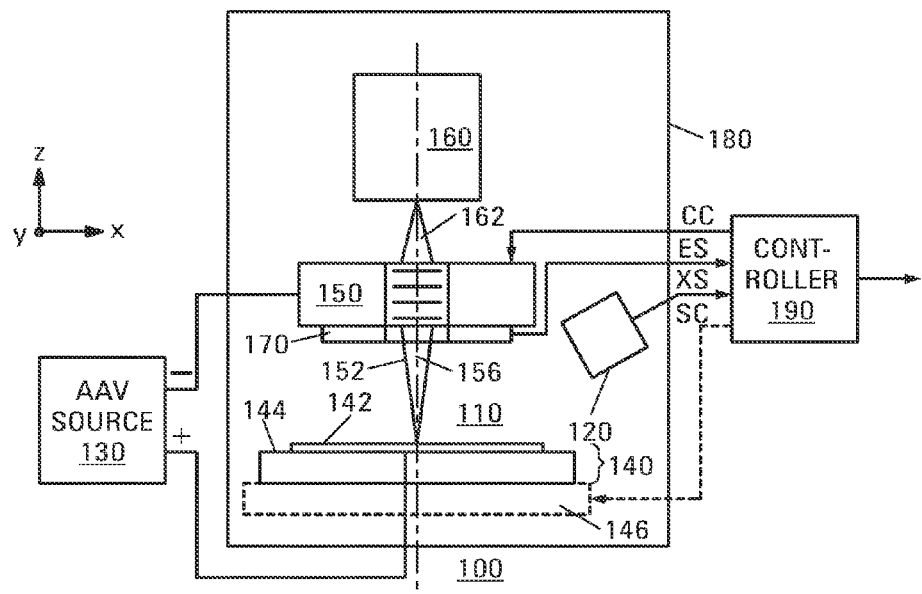
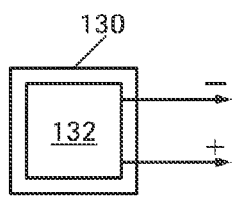
FIG.2A
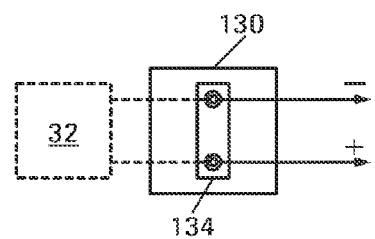
FIG.2B
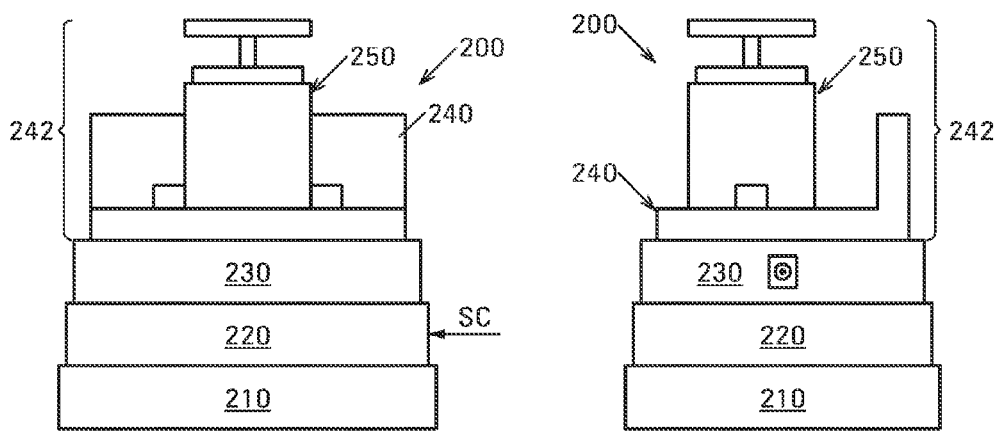

HIGH-VOLTAGE ENERGY-DISPERSIVE SPECTROSCOPY USING A LOW-VOLTAGE SCANNING ELECTRON MICROSCOPE

BACKGROUND

Layered electron beam columns are described in U.S. Pat. Nos. 7,045,794, 7,109,486, 7,332,729, and 7,335,895, now assigned to the assignee of this disclosure, and in U.S. Pat. Nos. 8,003,952, 8,106,358, 8,110,801, and 8,115,168, assigned to the assignee of this disclosure. A layered electron beam column is composed of a stack of layers of insulating materials such as ceramic, glass and undoped semiconductor. Each layer supports a respective miniature component capable of extracting, accelerating, collimating, focusing, blanking, or steering, etc., an electron beam. The use of a layered electron beam column allows a scanning electron microscope (SEM) to be reduced in size from a room-sized instrument to a benchtop instrument. Scanning electron microscopes similar in size to a typical laser printer are now commercially available, for example, the model 8500 FT-SEM sold by Agilent Technologies, Inc., Santa Clara, Calif.

Energy dispersive spectroscopy (EDS) is described by Joseph Goldstein et al. in Chapter 7 of *Scanning Electron Microscopy and X-ray Microanalysis*, 3rd ed., (Springer US 2003). Energy dispersive spectroscopy can be used for material identification and quantification of the constituents of a sample. To uniquely identify a particular atomic species in a sample, at least two X-ray lines need to be identified. The electron beam energy needed to generate x-rays at at least two wavelengths from a given atomic species increases with atomic number. For example, to uniquely identify atomic species with atomic numbers greater than 14 requires an electron beam energy greater than 2 keV. Conventional SEMs use beam energies substantially greater than 2 keV, and can therefore offer full-spectrum EDS as an auxiliary feature. However, voltage maxima in the layered electron beam column of current layered electron beam column benchtop SEMs limit the electron beam energy to less than that needed to generate x-rays at multiple wavelengths from a full spectrum of atomic species. Consequently, current layered electron beam column benchtop SEMs offer only a part-spectrum capability.

Accordingly, what is needed is an SEM with a layered electron beam column that has a full-spectrum EDS capability.

BRIEF DESCRIPTION OF THE DRAWINGS

FIG. 1 is a block diagram showing an example of a scanning electron microscopy and energy dispersive spectroscopy apparatus.

FIGS. 2A and 2B are schematic block diagram showing examples of an auxiliary acceleration voltage source.

FIGS. 3A and 313 are a schematic front view and a schematic side view, respectively, of a sample holder assembly that constitutes the sample holder in some embodiments of the spectroscopy apparatus shown in FIG. 1.

DETAILED DESCRIPTION

Figure 3C:
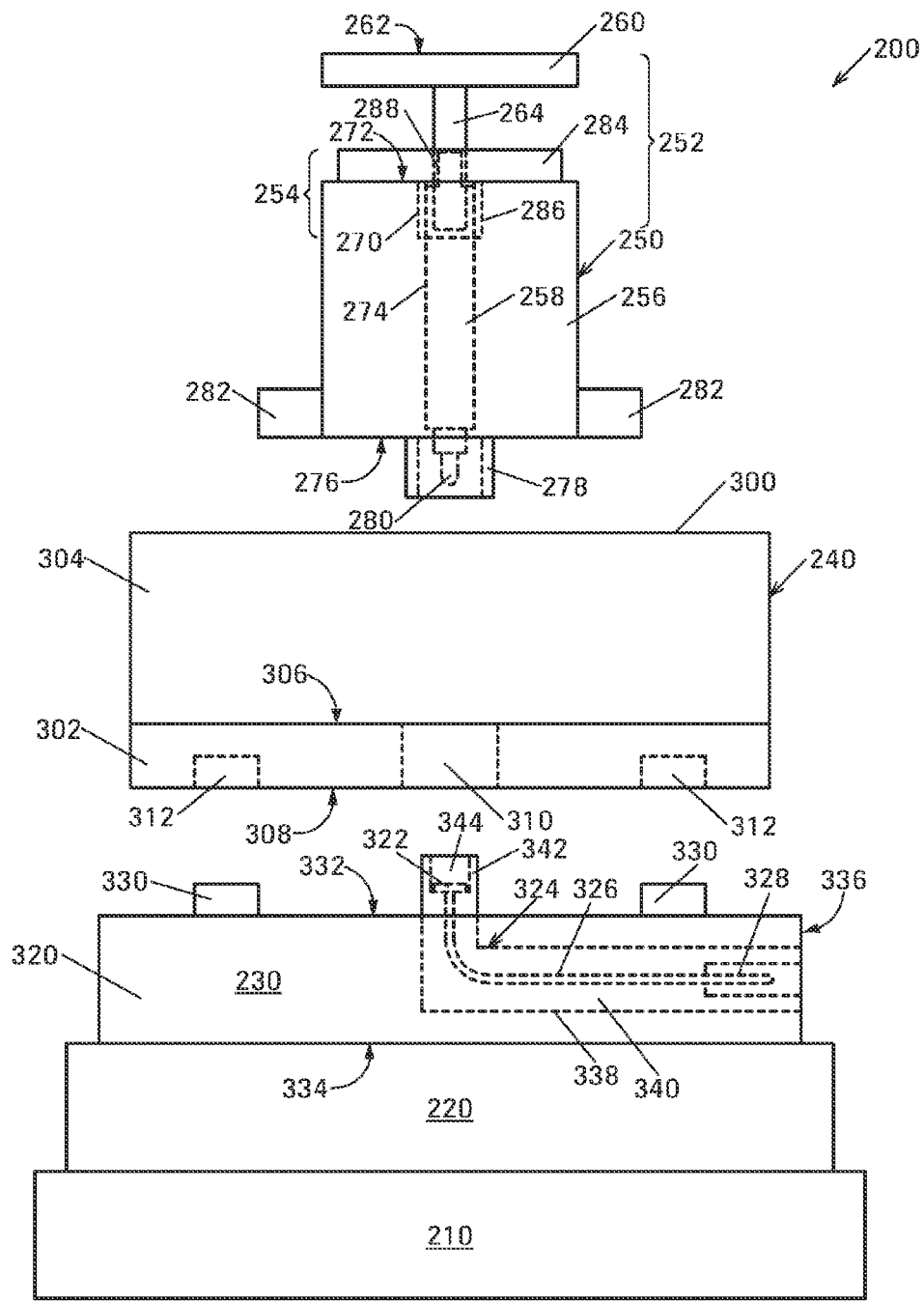
FIGS. 3C and 3D are enlarged and exploded versions of FIGS. 3A and 3B, respectively.

FIG. 1 is a block diagram showing an example 100 of a scanning electron microscopy and energy dispersive spectroscopy apparatus in accordance with this disclosure. Spectroscopy apparatus 100 includes a scanning electron microscope (SEM) 110, and x-ray detector 120, and an auxiliary acceleration voltage source 130. SEM 110 includes a sample holder 140, and a layered electron beam column 150. Layered electron beam column 150 is arranged to output an electron beam 152 towards sample holder 140 at an initial beam energy. Layered electron beam column 150 has a column axis 156 along which electron beam 152 in its un-steered state is output.

In the example shown, SEM 110 additionally includes an electron source 160 and an electron detector 170. Electron source 160 is located on the column axis 156 of layered electron beam column 150 on the side of the layered electron beam column remote from sample holder 140. Electron source 160 provides electrons 162 to layered electron beam column 150. A voltage applied between electron source 160 and layered electron beam column 150 defines the initial beam energy of electron beam 152. In the example shown, electron detector 170 is mounted on a surface of layered electron beam column 150 facing sample holder 140, and generates an electron detection signal ES in response to electrons incident thereon. Layered electron beam column 150 and sample holder 140 are arranged such that electron beam 152 in its un-steered state is incident at the center of sample holder 140 with the sample holder at its home position.

SEM 110 additionally includes a controller 190 that applies column control signals CC to layered electron beam column 150. Column control signals CC, at least some of which are in the kilovolt range, cause the layered electron beam column to perform such functions as extracting, accelerating and collimating electrons 162, and focusing, blanking and steering electron beam 152. Controller 190 additionally receives electron detection signal ES from electron detector 170.

The thinness of the layers constituting layered electron beam column 150 imposes limitations on the voltages of column control signals CC that can be applied within the electron beam column. These voltage limitations in turn impose a limitation on the initial beam energy of electron beam 152. The highest initial beam energy of electron beam 152 output by an example of layered electron beam column 150 is about 2 keV.

To identify a constituent atomic species of a sample using EDS requires that electron beam 152 be incident on the sample with a beam energy sufficiently high to generate x-rays at multiple wavelengths, but at least at two different wavelengths. Electron beam 152 at its initial beam energy of, for example, about 2 keV is capable of generating x-rays at multiple wavelengths from only the first 14 atomic species of the periodic table, i.e., hydrogen through nitrogen. Detecting and quantifying atomic species with atomic numbers greater than 14 is also of interest. Accordingly, spectroscopy apparatus 100 additionally includes auxiliary acceleration voltage (AAV) source 130 that provides spectroscopy apparatus 100 with the capability to perform EDS on samples containing atomic species with an atomic number greater than the atomic number corresponding to the initial beam energy of electron beam 152.

Auxiliary acceleration voltage source 130 applies an acceleration voltage between sample holder 140 and layered electron beam column 150. Specifically, auxiliary acceleration voltage source 130 sets sample holder 140 to a more positive voltage than layered electron beam column 150. The auxiliary acceleration voltage accelerates electron beam 152 to a final beam energy. At its final beam energy, electron beam 152 is capable of generating x-rays at multiple wavelengths from a larger range of atomic species than electron beam 152 at its initial beam energy. A range of atomic species includes the atomic species with consecutive atomic numbers between hydrogen and the atomic species with the highest atomic number from which the electron beam at its final beam energy is capable of generating x-rays at multiple wavelengths. The auxiliary acceleration voltage is not subject to the maximum voltage limitations of layered electron beam column 150, and can therefore be made as large as is necessary for the range of atomic species from which electron beam 152 at its final beam energy is capable of generating x-rays at multiple wavelengths to include a highest atomic weight atomic species of interest.

In an example, a final beam energy of 15 keV is needed to generate x-rays at multiple wavelengths from the highest atomic weight atomic species of interest, and the initial beam energy of electron beam 152 is 2 keV. In this example, auxiliary acceleration voltage source 130 applies an auxiliary acceleration voltage of 13 kV between sample holder 140 and layered electron beam column 150. With such an auxiliary acceleration voltage applied between sample holder 140 and layered electron beam column 150, the landing energy of electron beam 152 at the sample is 15 keV and the range of atomic species from which electron beam 152 can generate x-rays at multiple wavelengths is comparable with that of a conventional SEM operating with a beam energy of 15 keV.

In an example, SEM 110 additionally includes an armature (not shown) to which electron source 160, layered electron beam column 150, sample holder 140, and x-ray detector 120 are coupled. The armature defines the spatial relationship among the electron source, the layered electron beam column, the sample holder, and the x-ray detector. In the example shown, sample holder 140 includes a sample platform 142 that is electrically insulated from the armature, and, hence, from the remaining components of SEM 110, by an insulator 144 interposed between the sample platform and the armature. In the example shown, sample holder 140 is mounted on a positioning stage 146. In an example, positioning stage 146 is an XY stage that operates in response to stage control signals SC output by controller 190 to move sample holder 140 in the x-y plane relative to layered electron beam column 150. Positioning stage 146 moves sample holder 140 over a greater range of motion in the x-y plane than the range of motion obtained by layered electron beam column 150 steering electron beam 152. In another example, positioning stage 146 is an XYZ stage that operates in response to stage control signals SC additionally to move sample holder 140 in the z-direction parallel to column axis 156. In yet another example, positioning stage 146 additionally operates in response to stage control signals SC to rotate sample holder 140 about an axis parallel to the column axis and/or to tilt the sample holder about an axis parallel to the x-y plane. In other examples, sample holder 140 is mounted on the armature in a fixed position relative to layered electron beam column 150.

SEM 110 and x-ray detector 120 are housed within a vacuum chamber 180. In an example, a wall (not shown) divides the vacuum chamber into a ultra high vacuum (UHV) section (not shown) and a high vacuum (HV) section (not shown). The wall includes an isolation valve (not shown) located on column axis 156. Electron source 160, layered electron beam column 150, and electron detector 170 are located within the UHV section, and x-ray detector 120 and sample holder 140 are located within the HV section. Vacuum chamber 180 is differentially pumped to maintain a pressure of typically $10^{-9}$-$10^{-10}$ Torr within the UHV section, and to maintain a pressure of typically $10^{-4}$-$10^{-5}$ Ton within the HV section during scanning electron microscopy and/or energy dispersive spectroscopy operations. The isolation valve can be moved into position to seal the LAN section, which allows the HV section to be vented to the atmosphere to exchange samples while maintaining the ultrahigh vacuum within the UHV section. The RV section is then evacuated to high vacuum prior to spectroscopy apparatus 100 being used to perform scanning electron microscopy and/or energy dispersive spectroscopy operations. Because of the small dimensions of SEM 110, the dimensions of vacuum chamber 180 are correspondingly small and only a few minutes to are needed to evacuate the HV section of vacuum chamber 180 to its operating pressure.

In some embodiments of spectroscopy apparatus 100, an electron beam column lacking the layered structure of layered electron beam column 150, but subject to a voltage limitation that limits the electron beam output by the electron beam column to an initial beam energy incapable of generating x-rays at multiple wavelengths from atomic species having atomic numbers greater than a threshold atomic number is substituted for electron beam column 150. In such an embodiment, auxiliary acceleration voltage source 130 applies an auxiliary acceleration voltage between the electron beam column and sample holder 140 to accelerate the electron beam to a final beam energy at which the electron beam is capable of generating x-rays at multiple wavelengths from atomic species having atomic numbers greater than the threshold atomic number.

FIGS. 2A and 2B are schematic block diagram showing examples of auxiliary acceleration voltage source 130. In the example shown in FIG. 2A, auxiliary acceleration voltage source 130 includes a high-voltage power supply 132. In the example shown, high-voltage power supply 132 is located outside vacuum chamber 180. In another example, high-voltage power supply 132 is located within vacuum chamber 180. Power supplies that convert line-voltage AC or low-voltage DC to DC voltages in a range from 10,000 V to 20,000 V are commercially available and may be used. Alternatively, power supply circuits for converting line-voltage AC or low-voltage DC to DC voltages in this range are known and may be implemented.

In the example shown in FIG. 2B, auxiliary acceleration voltage source 130 includes a connector 134 to which a high-voltage power supply 32 external to spectroscopy apparatus 100 can be connected to provide the auxiliary acceleration voltage. In some examples, connector 134 is mounted on spectroscopy apparatus 100. In other examples, connector 134 is at the distal end of a cable that extends from spectroscopy apparatus 100. Connectors for connecting voltages in a range from 10,000 V to 20,000 V are commercially available and may be used.

Figure 3D:
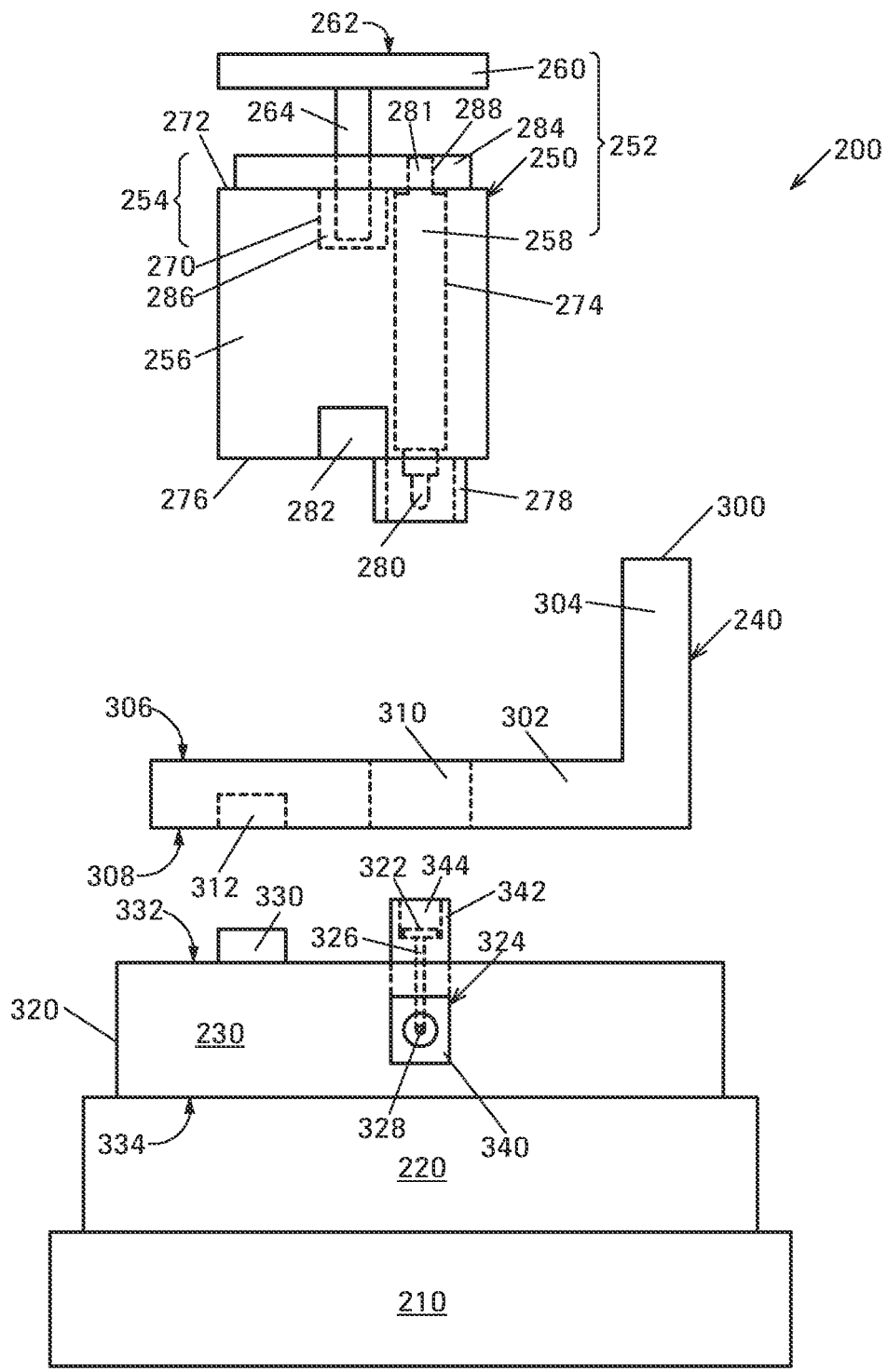

FIGS. 3A and 3B are a schematic front view and a schematic side view, respectively, of a sample holder assembly 200 that is used as sample holder 140 in some embodiments of spectroscopy apparatus 100. FIGS. 3C and 3D are enlarged and exploded versions of FIGS. 3A and 3B, respectively. In the example shown in FIGS. 3A-3D, sample holder assembly 200 includes a base 210, a positioning stage 220, a kinematic base 230, a sample carrier 240, and a sample holder 250. Positioning stage 220 is mounted on base 210 and operates in response to stage control signals SC received from controller 190 (FIG. 1) to position sample holder 250 in translation and/or in rotation relative to column axis 156. Kinematic base 230 is mounted on positioning stage 220. Sample carrier 240 is detachably mounted at a defined location on kinematic base 230. Sample holder 250 is mounted on sample carrier 240. Sample holder 250 and sample carrier 240 collectively constitute a sample carrier assembly 242. In an example, positioning stage 220 moves kinematic base 230 and sample carrier assembly 242 in the x-, y-, and z-directions. In another example, positioning stage 220 moves kinematic base 230 and sample carrier assembly 242 in the x- and y-directions. In other examples, positioning stage 220 additionally rotates kinematic base 230 and sample carrier assembly 242 about an axis parallel to the z-direction and/or tilts kinematic base 230 and sample carrier assembly 242 about an axis parallel to the x-y plane. Base 210 connects sample holder assembly 200 to the armature (not shown) of spectroscopy apparatus 100 in a position such that, when positioning stage 220 is at its home position, sample holder 250 is centered on the column axis 156 of layered electron beam column 150.

Sample carrier assembly 242, composed of sample holder 250 mounted on sample carrier 240, is easily removable from kinematic base 230 located in vacuum chamber 180 to enable a sample to be placed on sample holder 250. The sample carrier assembly with the sample on sample holder 250 is then replaced on the kinematic base in the vacuum chamber. The electrical connection between auxiliary acceleration voltage source 130 (FIG. 1) and sample holder 250 runs through part of sample holder assembly 200. The electrical connection is broken automatically when sample carrier assembly 242 is removed from kinematic base 230, and is restored automatically when the sample carrier assembly is replaced on the kinematic base.

Sample holder assembly 200 operates in response to stage control signals SC received from controller 190 (FIG. 1) to move sample holder 250 relative to layered electron beam column 150 in the x-y plane over a greater range of motion than the range of motion obtained by steering electron beam 152. Sample holder assembly 200 additionally operates in response to the stage control signals to move sample holder 250 in the z-direction to maintain the surface of the sample at the location of the focal point of electron beam 152 notwithstanding variations in the z-direction dimension of the sample.

Referring now to FIGS. 3C and 3D, and in particular to FIG. 3D, in the example of sample holder assembly 200 shown, sample holder 250 includes a sample platform 252, a platform mount 254, an insulator tower 256 and a spring-loaded contact assembly 258. Sample platform 252 includes a sample plate 260 having a planar major surface 262 on which a sample (not shown) can be placed for analysis. A pedestal 264 extends orthogonally from the center of the major surface of sample plate 260 opposite major surface 262. In the example shown, sample plate 260 is circular in shape, pedestal 264 is cylindrical in shape and insulator tower 256 is substantially cylindrical in shape. Other shapes of these elements are possible and may be used. A blind bore 270 extends into insulator tower 256 from at or near the center of one end surface 272 thereof, and an off-center bore 274 extends through the insulator tower from end surface 272 to an end surface 276 opposite end surface 272. Spring-loaded contact assembly 258 is accommodated within off-center bore 274. A hollow, cylindrical insulator 278 extends axially from end surface 276 around off-center bore 274 to protect the spring contact 280 of spring-loaded contact assembly 258. Lugs 282 extend radially from insulator tower 256 adjacent end surface 276.

Platform mount 254 includes a mounting plate 284 having a bushing 286 at or near its center and having an off-center through hole 288 extending between its major surfaces. Platform mount 254 is attached to insulator tower 256 with bushing 286 located in blind bore 270, mounting plate 284 in contact with end surface 272, and the end 281 of spring-loaded contact assembly 258 remote from spring contact 280 engaged with through hole 288. In an example, platform mount 254 is affixed to insulator tower 256 by machine screws (not shown) passing through holes (not shown) in mounting plate 284 into threaded holes (not shown) in insulator tower 256. Sample platform 252 is mounted on insulator tower 256 by inserting the end of the pedestal 264 remote from sample plate 260 into the bushing 286 of platform mount 254.

Sample carrier 240 includes a substantially L-shaped armature 300, that can be regarded as having a mounting portion 302 and a handle portion 304. Handle portion 304 facilitates the manipulation of sample carrier assembly 242 as the sample carrier assembly is removed from, and placed on, kinematic base 230. Mounting portion 302 has opposed, parallel, planar major surfaces 306, 308. A through hole 310 extends through mounting portion 302 between major surfaces 306, 308. Alignment holes 312 extend into mounting portion 302 from major surface 308. In the example shown, alignment holes 312 are blind holes that extend partway into mounting portion 302. In another example, alignment holes 312 extend all the way through mounting portion 302.

When sample holder 250 is mounted on sample carrier 240 to form sample carrier assembly 242 (FIGS. 3A, 3B), insulator tower 256 is mounted on the mounting portion 302 of sample carrier 240 with the end surface 276 of the insulator tower abutting major surface 306 and cylindrical insulator 278 and spring contact 280 located within through hole 310. In an example, insulator tower 256 is affixed to mounting portion 302 by machine screws (not shown) passing through lugs 282 into threaded holes (not shown) in mounting portion 302. When mounted as described, the planar major surface 262 of the sample plate 260 of sample holder 250 is parallel to the major surface 306 of mounting portion 302.

Best seen in FIG. 3C, kinematic base 230 includes a base plate 320, a fixed contact 322, an insulated cavity 324, a conductor 326, a connector 328 and alignment protrusions 330. Base plate 320 has opposed, parallel, planar major surfaces 332, 334, and an end surface 336 that extends between the major surfaces. An L-shaped cavity 338 extends into base plate 320 in the minus z-direction from major surface 332, and in the minus x-direction from end surface 336. Conductor 326 runs along the axes of cavity 338 from fixed contact 322 to connector 328. Cavity 338 is filled with an electrical insulator 340 to form insulated cavity 324 in which conductor 326 is insulated from base plate 320. Additionally, insulator 340 is shaped to define a hollow, cylindrical insulator 342 surrounding, and extending in the z-direction relative to, fixed contact 322, and to define a cavity 344 around the fixed contact. A flexible cable (not shown) having on one end a connector (not shown) configured to mate with connector 328 is used to connect connector 328 to the positive output terminal of auxiliary acceleration voltage source 130 (FIG. 1). Alignment protrusions 330 extend in the z-direction from major surface 332 in alignment with the alignment holes 312 of sample carrier 240.

When sample carrier assembly 242 is mounted on kinematic base 230, the major surface 308 of the mounting portion 302 of sample carrier 240 abuts the major surface 332 of kinematic base 230 to define the location of sample carrier assembly 242 in the z-direction, and alignment holes 312 engage with alignment protrusions 330 extending from the major surface 332 of the kinematic base to define the position of sample carrier assembly 242 in the x-y plane relative to the kinematic base. Sample carrier assembly 242 is retained in position on kinematic base 230 by gravity, but can be secured, for example, using suitable fasteners. Other ways of defining the alignment of sample carrier assembly 242 relative to kinematic base 230 are known and may be used.

Additionally, cylindrical insulator 278 protruding from insulator tower 256 receives cylindrical insulator 342 protruding from the major surface 332 of kinematic base 230, and, within the volume defined by the cylindrical insulators, spring contact 280 extending from spring-loaded contact assembly 258 electrically contacts fixed contact 322. This forms a robust electrical connection via pedestal 264, platform mount 254, spring-loaded contact assembly 258, spring contact 280, fixed contact 322, conductor 326 and connector 328 between the sample plate 260 of sample holder 250 and the flexible cable (not shown) connected to auxiliary acceleration voltage source 130. As noted above, the electrical connection is automatically broken when sample carrier assembly 242 is removed from kinematic base 230, and is automatically restored when the sample carrier assembly is placed on the kinematic base.

Referring again to FIG. 1, during operation of spectroscopy apparatus 100, controller 190 initially controls SEM 110 to perform a conventional scanning electron microscopy (SEM) operation to identify the location of a feature of interest on a sample (not shown) placed on sample holder 140. No auxiliary acceleration voltage is applied between sample holder 140 and led electron beam column 150 during the SEM operation. In the SEM operation, controller 190 provides column control signals CC to layered electron beam column 150 to cause the layered electron beam column to steer electron beam 152 to perform a raster scan of the surface of the sample. For large samples, controller 190 additionally provides stage control signals SC to positioning stage 146 to cause the positioning stage to move the sample in steps in the x- and y-directions relative to the column axis 156 of layered electron beam column 150. In an example, the steps in which the positioning stage moves in the x- and y-directions are equal to the x- and y-dimensions, respectively, of the area of the sample holder scanned by the electron beam with the sample holder in a static position. In this disclosure, this scanned area will be referred to as the field of view of the electron beam, and the length of the field of view in the x-direction or in the y-direction will be referred to as the scan length of the electron beam. At each step of the movement of the positioning stage, controller 190 provides column control signals CC to layered electron beam column 150 to cause the layered electron beam column to perform a raster scan of the portion of the sample centered on column axis 156. Electron detector 170 detects the back-scattered electrons and secondary electrons stimulated by electron beam 152 at its initial beam energy to generate electron detection signal ES. Controller 190 associates values of electron detection signal ES with the X and Y coordinates of the location at which the electron beam is incident on the sample to generate an image signal.

Controller 190 then activates auxiliary acceleration voltage source 130 to apply the auxiliary acceleration voltage between layered electron beam column 150 and sample holder 140, and provides column control signals CC to layered electron beam column 150 to cause the layered electron beam column to steer electron beam 152 to the location of the feature of interest on the sample. In some embodiments, with large samples, controller 190 additionally provides stage control signals SC to positioning stage 146 to cause the positioning stage to align a portion of the sample containing the feature of interest with the column axis 156 of layered electron beam column 150. In response to electron beam 152 at its final beam energy, the feature of interest on the sample emits x-rays at wavelengths that depend on the atomic species constituting the feature of interest. X-ray detector 120 detects the x-rays and in response thereto generates x-ray detection signal XS. X-ray detector 120 outputs x-ray detection signal XS to controller 190. Controller 190 processes the x-ray detection signal to obtain a spectrum from which the atomic species constituting the feature of interest can be identified.

However, application of the auxiliary acceleration voltage between layered electron beam column 150 and sample holder 140 changes the relationship between column control signals CC that control the steering of electron beam 152 by layered electron beam column 150 and the location at which electron beam 152 is incident on the sample. Thus, a calibration operation should be performed prior to using layered electron beam column 150 to steer electron beam 152 to the location of the feature of interest on the sample with the auxiliary acceleration voltage applied.

FIGS. 4A-4D are schematic drawings showing examples of the effect of the auxiliary acceleration voltage on the trajectories of the electrons of electron beam 152 (FIG. 1) and the range over which layered electron beam column can scan electron beam 152. The examples shown in FIGS. 4A-4D are highly simplified and idealized. Factors such as edge effects, surface roughness or topography, stray fields, and the geometry of the sample that can affect the trajectories of electron beam 152 are ignored in the following description on the assumption that the effect of these factors on the trajectories is relatively small compared with the below-described effect of the auxiliary acceleration voltage. Each of FIGS. 4A-4D shows layered electron beam column 150, column axis 156, sample platform 142 and a sample S on the surface of the sample platform. Sample platform 142 is centered in the x-y plane on the column axis 156 of layered electron beam column 150 in FIGS. 4A and 4B. Sample platform 142 is off-center in the x-direction relative to column axis 156 in FIGS. 4C and 4D. No auxiliary acceleration voltage is applied in FIGS. 4A and 4C. The auxiliary acceleration voltage is applied between sample platform 142 and layered electron beam column 150 in FIGS. 4B and 4D. Each figure additionally shows the 2-D image resulting from each scan. The image is a scanning electron image in FIGS. 4A and 4C, and an x-ray image in FIGS. 4B and 4D.

Figures 4A, 4B:
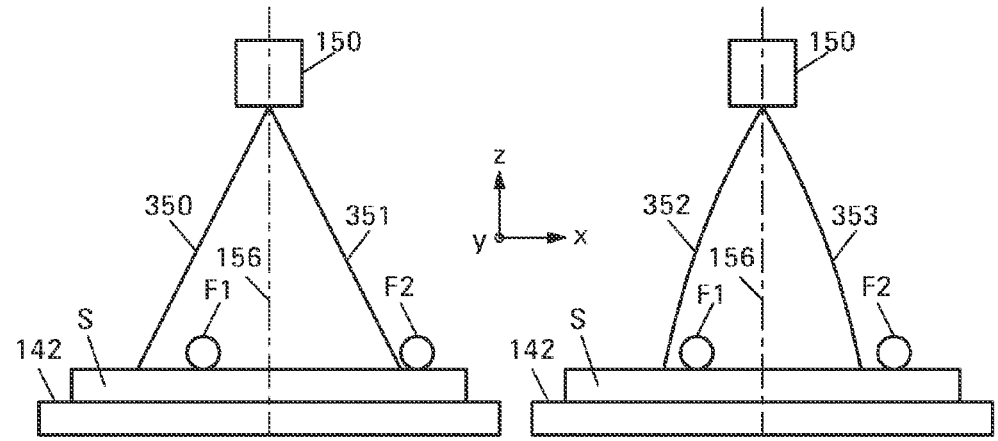
FIGS. 4A-4D are schematic drawings showing examples of the effect of the auxiliary acceleration voltage on the trajectories of the electrons of the electron beam and the range over which the electron beam can be scanned in the spectroscopy apparatus shown in FIG. 1.

In FIG. 4A, SEM 110 is used to generate a scanning electron microscopy image of the surface of sample S with sample platform 142 grounded. Sample S has a first feature F1 and a second feature F2 on its surface. Feature F2 is located further off-center relative to the sample and feature F1. Lines 350, 351 indicate the trajectories of electron beam 152 at the extreme deviations of the scan of the electron beam from column axis 156.

In FIG. 4B, SEM 110 is used to generate an energy dispersive spectroscopy image of sample S with the auxiliary acceleration voltage applied between sample platform 142 and layered electron beam column 150. The auxiliary acceleration voltage applied to sample platform 142 attracts the electrons of electron beam 152 causing the electrons to be deflected, in this example, towards the sample platform. This results in the electrons in the electron beam 152 having altered trajectories (indicated at the extreme deviations of the scan by lines 352, 353), and the field of view on sample S typically having reduced dimensions in the x-y plane. However, the coordinates of feature F1 in the field of view, relative to the center of the field of view, scale proportionally to the reduced dimensions of the field of view. In case of the cylindrical symmetry resulting from sample platform 142 being centered on column axis 156, the reduction in the scan length of the electron beam is symmetric with respect to column axis 156. Such a symmetrical arrangement, however, is not required for calibration.

Figures 4C, 4D:
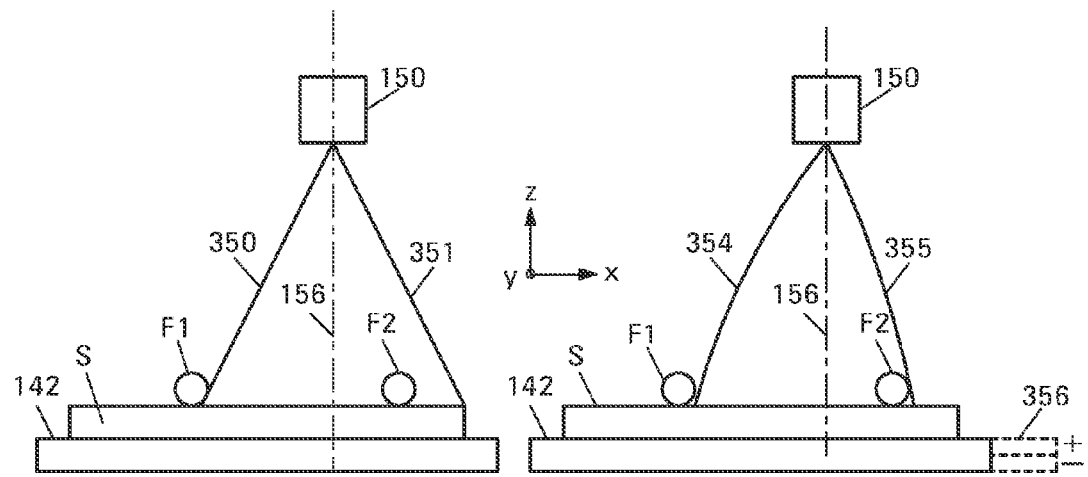

Conditions in FIG. 4C are the same as those in FIG. 4A, except that sample platform 142 has been displaced laterally in the −x-direction so that feature F2 can be imaged. Consequently, sample platform 142 is no longer centered in the x-y plane on column axis 156. Despite this asymmetry, the trajectories of electron beam 152, indicated by lines 350, 351, and the generated image are the same as the electron beam trajectories and the generated image, respectively, shown in FIG. 4A.

Conditions in FIG. 4D are the same as those in FIG. 4B, except that sample platform 142 has been displaced laterally in the −x-direction, similar to FIG. 4C. The off-center position of sample platform 142 relative to column axis 156 modifies the trajectories of electrons of electron beam 152 (indicated at the extreme deviations of the scan by lines 354, 355), shifting them in the direction of displacement of the sample platform. The coordinates of feature F2 in the field of view, relative to the center of the field of view, again scale proportionally to the reduced dimensions of the field of view, but feature F2 is additionally shifted in the x-direction relative to the center of the field of view.

The effect of moving sample platform 142 laterally can be modeled by adding a virtual piece 356 of sample platform to the sample platform to restore the symmetry of the sample platform relative to column axis 156. If the auxiliary acceleration voltage were applied to virtual piece 356, the trajectory of electrons of electron beam 152 would be exactly the same as that shown in FIG. 4B. This assumes that the distance between layered electron beam column 150 and sample platform 142 is much smaller than the size of the sample platform in the x-y plane. However, the net charge on virtual piece 356 is zero. This condition can be achieved by offsetting the positive charge resulting from the auxiliary acceleration voltage with an equal and opposite negative charge. The additional negative charge moves the field of view in the −x-direction, the direction in which sample platform 142 is shifted.

Figure 5:
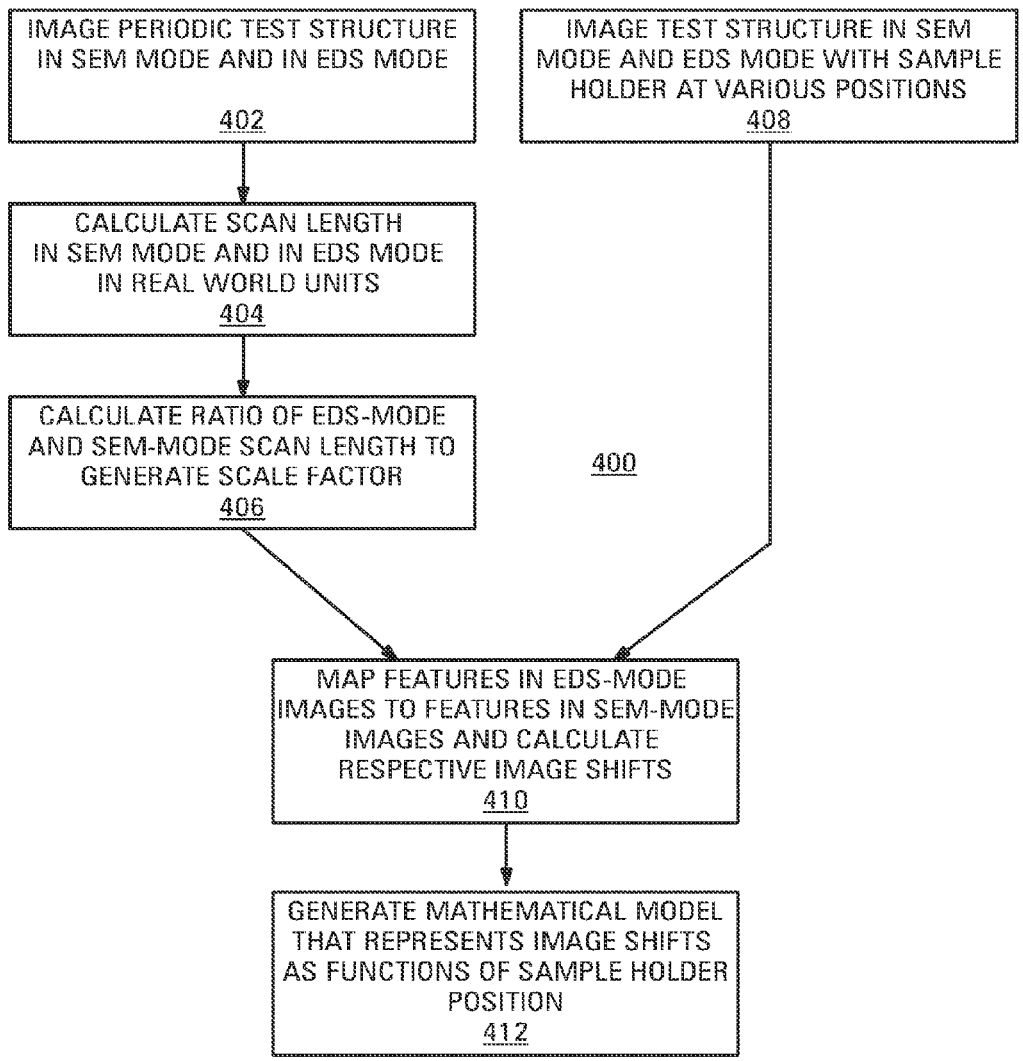
FIG. 5 is a flowchart showing an example of a method for calibrating the spectroscopy apparatus shown in FIG. 1.

FIG. 5 is a flowchart showing an example 400 of a process for calibrating scanning electron microscopy and energy dispersive spectroscopy apparatus 100. In an embodiment, calibration process 400 is typically performed by controller 190 (FIG. 1). The calibration process calculates a scale factor between an image generated by spectroscopy apparatus 100 in scanning electron microscopy mode (SEM mode), with auxiliary acceleration voltage turned off, and an image generated by the spectroscopy apparatus in energy dispersive spectroscopy mode (EDS mode), i.e., with the auxiliary acceleration voltage turned on. The calibration process additionally calculates an image shift between an image generated by spectroscopy apparatus 100 in SEM mode and an image generated by spectroscopy apparatus 100 in EDS mode. While the calibration method could be refined to produce calibration data with an accuracy sufficient to enable the location of a feature of interest on a sample determined in SEM mode to be translated directly to stage control signals SC and column control signals CC that achieve the same relative positioning between the electron beam and the sample in EDS mode, the calibration method described below produces calibration data with only with the accuracy needed to enable an indirect positional translation. The accuracy of the calibration data is sufficient to ensure that the feature of interest is located within the field of view of the electron beam in EDS mode. With the sample positioned relative to the electron beam such that the feature of interest is within the field of view of the electron beam, an EDS-mode image is generated, the position of the feature of interest in the EDS-mode image is determined, and the electron beam is then steered to the determined position of the feature of interest to perform the energy-dispersive spectroscopy.

In calibration process 400, in block 402, a periodic test structure is placed on sample holder 140, and SEM 110 is operated to generate images of the periodic test structure. An SEM-mode image is generated in SEM mode, i.e., with auxiliary acceleration voltage turned off, and an EDS-mode image is generated in EDS mode, i.e., with the auxiliary acceleration voltage turned on. Sample holder 140 remains static during this operation.

In block 404, a scan length of electron beam 152 with SEM 110 in SEM mode, i.e., with auxiliary acceleration voltage turned off, and a scan length of the electron beam with SEM 110 in EDS mode, i.e., with the auxiliary acceleration voltage turned on, are calculated in real-world units, such as millimeters. As noted above, the scan length of electron beam 152 is the x-direction or y-direction dimension of the field of view of the electron beam, and the field of view of the electron beam is the area of sample platform 142 scanned by the electron beam. In an example, the respective scan length is calculated by determining the number of periods of the periodic test structure in the direction corresponding to the scan length in each image. The number of periods in each image is then multiplied by the known pitch of the periodic structure to generate the respective scan length.

In block 406, a ratio of the scan lengths calculated in block 404 is calculated to provide the scale factor calibration. In an example, the scan length of the EDS-mode image is divided by the scan length of the SEM-mode image to generate the scale factor calibration. In another example, x-direction scan length of the EDS-mode image is divided by an x-direction scan length of the SEM-mode image to generate an x-direction ratio, a y-direction scan length of the EDS-mode image is divided by a y-direction scan length of the SEM-mode image to generate a y-direction ratio, and the x-direction ratio and the y-direction ratio are averaged to provide the scale factor calibration.

In block 408, a non-periodic test structure containing distinct features is placed on sample holder 140, and SEM 110 is operated to image the non-periodic test structure with sample holder 140 located in a number of different positions in the x-y plane relative to column axis 156. In an example, the positions of the sample holder are offset from one another in the x-direction or the y-direction by distances equal to the EDS mode x-direction scan length and the EDS mode y-direction scan length, respectively. In another example, a substantially larger offset is used. In each position of the sample holder, a respective pair of images is generated. Each pair of images consists of one SEM-mode image taken with the auxiliary acceleration voltage turned off, and one EDS-mode image taken with the auxiliary acceleration voltage turned on.

In block 410, for each position of sample holder 140, from the respective pair of images taken at that position, a feature in the respective SEM-mode image is mapped to the same feature in the EDS-mode image using the scale factor calculated in block 406, and an image shift between the feature in the mapped SEM-mode image and the feature in the EDS-mode image is calculated to provide a respective image shift.

In block 412, a mathematical model is generated that represents the image shifts between the features in the mapped SEM-mode images and corresponding features in the EDS-mode images as functions of the position of the sample holder. In an example, the mathematical model is a mathematical equation that, for any position of sample holder 140, quantifies the image shift that occurs when SEM 110 is switched from SEM mode to EDS mode. In another example, the mathematical model is a table that, for any position of sample holder 140, quantifies the image shift that occurs when the SEM is switched from SEM mode to EDS mode. Table data for positions of sample holder 140 intermediate between those at which images are generated in block 408 can be calculated by interpolation.

In embodiments of spectroscopy apparatus 100 in which positioning stage 146 is capable of tilting sample holder 140 about an axis parallel to the x-y plane, the symmetry shown in FIG. 4B does not exist except when sample holder 140 is parallel to the x-y plane. However, the calibration process described above with reference to FIG. 5 can be used to generate calibration data for such embodiments. The calibration process is performed at a number of discrete tilt angles of sample holder 140 to generate respective scale factors and image shifts. Scale factors and image shifts for tilt angles intermediate between the tilt angles at which the images are generated in blocks 402 and 408 can be calculated by interpolation.

Figure 6:
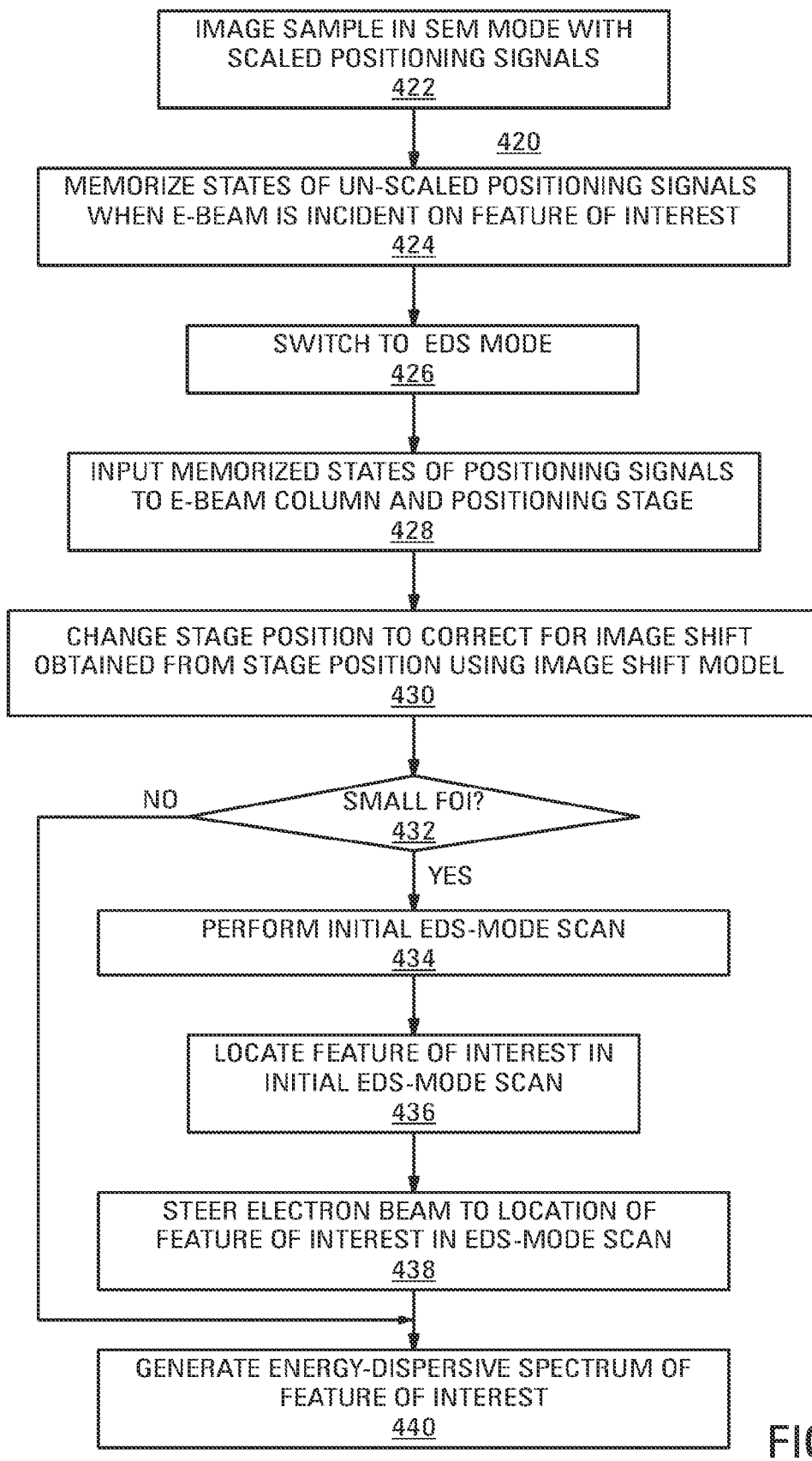
FIG. 6 is a flowchart showing an example of a method for generating the energy-dispersive spectrum of a feature of interest of a sample using the spectroscopy apparatus shown in FIG. 1

FIG. 6 is a flowchart showing an example 420 of a method for generating the energy-dispersive spectrum of a feature of interest of a sample using spectroscopy apparatus 100. In an embodiment, method is performed by controller 190 (FIG. 1). In block 422, SEM 110 is used to of SEM 110 are temporarily operated as if the SEM were in EDS mode. Specifically, the beam steering signals that constitute part of the column control signals CC generated by controller 190 (FIG. 1) are scaled by the scale factor generated in block 406 of calibration process 400 described above with reference to FIG. 5 (prior to being output to layered electron beam column 150. Scaling the beam steering signals makes the scan length of electron beam 152 in SEM mode equal to the scan length in EDS mode. Additionally, the stage control signals SC generated by controller 190 are scaled by the scale factor prior to being output to positioning stage 146. Scaling the stage control signals makes the positioning steps of positioning stage 146 in the SEM mode equal in size to the positioning steps of the positioning stage in EDS mode, and compensates for the reduced field of view of electron beam 152 caused by the scaled beam steering signals. The beam steering signals that constitute part of the column control signals CC and stage control signals SC are referred to herein collectively as positioning signals.

In block 424, the states of the original (un-scaled) positioning signals generated by controller 190 when electron beam 152 is incident on the feature of interest are memorized. In block 426, spectroscopy apparatus 100 is switched to EDS mode. To switch SEM 110 to EDS mode, the auxiliary acceleration voltage is applied between sample holder 140 and layered electron beam column 150, and the scaling is removed from the positioning signals. In block 428, the memorized states of the beam steering signals are input to layered electron beam column 150 and the memorized states of stage control signals SC are input to positioning stage 146. In block 430, the image shift corresponding to the current position of sample holder 140 is obtained from the mathematical model generated in block 412 of calibration process 400 and the positioning stage is operated in response to the image shift to move sample holder 140 a distance equal and opposite to the image shift. This locates the feature of interest within the field of view of electron beam 152. Alternatively, when the image shift is small, e.g., less than one half of the scan length of electron beam 152, the electron beam is steered a distance equal and opposite to the image shift to compensate for the image shift.

In block 432, a test is performed to determine whether the feature of interest is small. A small feature of interest is smaller than the field of view of electron beam 152 in EDS mode. A NO result in block 432 causes execution to advance to block 440, where the EDS spectrum of the feature of interest is generated, as will be described below. A YES result in block 432 causes execution to advance to block 434, described next.

In block 434, column control signals CC are provided to layered electron beam column 150 to cause the layered electron beam column to perform an initial EDS-mode scan. In the initial EDS-mode scan, a raster scan of the electron beam is performed while detecting x-rays of specific energies at x-ray detector 120. The x-ray energies are dependent on the material of the feature of interest.

In block 436, the position of the feature of interest in the initial EDS-mode scan is determined. Then, in block 438, column control signals CC are provided to layered electron beam column 150 to cause the electron beam column to steer electron beam 152 to the position of the feature of interest determined in block 436. Finally, block 440, the energy-dispersive spectrum of the feature of interest is generated by detecting the x-rays generated by electron beam 152 at its final beam energy incident on the feature of interest.

Referring briefly to FIG. 1, in the example of spectroscopy apparatus 100 shown therein, the close proximity of layered electron beam column 150 and sample holder 140 results in x-ray detector 120 being located substantially off-axis relative to column axis 156. With the off-axis location of the x-ray detector, the signal-to-noise ratio of the x-ray detection signal XS output by the x-ray detector may be less than optimum.

X-ray detectors are typically highly sensitive to electrons. Electron beam 152 incident at its final beam energy on a sample (not shown) placed on sample holder 140 generates not only x-rays but also backscatter electrons and secondary electrons that are emitted towards x-ray detector 120. Conventionally, x-ray detector 120 would include an electron trap to filter out electrons that would otherwise impair the signal-to-noise ratio of x-ray detection signal XS. As well as increasing the range of atomic species from which x-rays can be generated at multiple wavelengths, the auxiliary acceleration voltage acts as an inherent electron trap. The auxiliary acceleration voltage accelerates the backscatter electrons and secondary electrons towards sample holder 140, and, hence, away from x-ray detector 120. This allows a simpler x-ray detector that lacks a separate electron trap to be used as x-ray detector 120. The simpler x-ray detector is small enough to be integrated with layered electron beam column 150, which allows the x-ray detector to be located much closer to column axis 156.

Figure 7A:
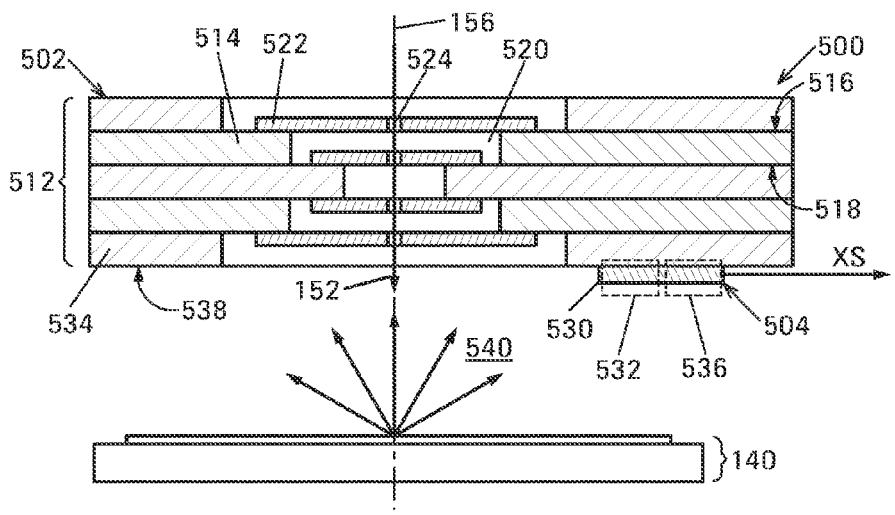
FIGS. 7A-7C, 8 and 9 are cross-sectional views showing examples of an x-ray generation and detection system that constitutes part of some embodiments of the spectroscopy apparatus shown in FIG. 1.

FIGS. 7A-7D, 8 and 9 are cross-sectional views showing examples of an x-ray generation and detection system that may be used as layer electron beam column 150 and x-ray detector 120 in spectroscopy apparatus 100 described above with reference to FIG. 1. FIG. 7A shows an example 500 of an x-ray generation and detection system composed of a layered electron beam column 502 and an integrated x-ray detector 504. An example of a solid state x-ray detector that can be integrated with layered electron beam column 502 is a silicon drift detector (SDD). This type of detector has a small anode capacitance compared to conventional x-ray detectors such as Si(Li) and germanium x-ray detectors. The small anode capacitance of the SDD leads to a higher energy resolution at shorter shaping times compared with conventional x-ray detectors. This is advantageous in high-count rate applications.

Silicon drift detector dies that include a silicon drift detector and integrated amplifying electronics fabricated in and on the die have been developed and are commercially available. Such detectors provide adequate signal-to-noise ratios at room temperature. In applications that require an increased signal-to-noise ratio, the SDD can be mounted on the cold surface of a cooling system to allow operation at temperatures down to about −15° C., as will be described below with reference to FIG. 8. SDD dies are more robust than other types of x-ray detectors for non-laboratory and environmental applications because noise caused by mechanical vibrations is eliminated and electrical pickup is significantly reduced.

In the example shown in FIG. 7A, layered electron beam column 502 includes a stack 512 of insulating layers. An exemplary insulating layer is shown at 514. Reference numeral 514 will additionally be used to refer to insulating layers in general. Insulating layer 514 has a planar major surface 518 facing sample holder 140 when layered electron beam column 502 constitutes part of SEM 110 (FIG. 1). Insulating layer 514 additionally has a planar major surface 518 opposite and parallel to major surface 516, and a bore 520 extending between major surfaces 516, 518 near the center of the major surfaces. Insulating layer 514 has a functional element 522 mounted on the major surface 516 and overlapping bore 520. Reference numeral 522 will additionally be used to refer to functional elements general. Functional element 522 has a centrally-located electron path 524. The others of the insulating layers are similar to insulating layer 514, but some have a respective functional element mounted on each of its major surfaces, some have no functional element mounted thereon, and some have a respective functional element mounted on their major surface 518 instead of major surface 516. Insulating layers 514 are stacked with the respective electron paths 524 of their functional elements 522 centered on column axis 156. Column control signals CC (FIG. 1) applied to the functional elements and/or between the functional elements enable layered electron beam column 502 to perform such functions as extracting and collimating electrons 162 output by electron source 160 (FIG. 1), and focusing, blanking and steering electron beam 152 output by layered electron beam column 502.

In the example shown, integrated x-ray detector 504 is in the form of a silicon drift detector (SDD) die 530. SDI) die 530 includes a silicon drift detector 532 and integrated amplifying electronics 536. Silicon drift detector 532 generates a detection signal in response to x-rays 540 incident thereon. Amplifying electronics 536 amplify the detection signal generated by silicon drift detector 532 to generate a robust x-ray detection signal XS for output to controller 190 (FIG. 1).

SDD die 530 is mounted on the insulating layer 534 of layered electron beam column 502 closest to sample holder 140. Specifically, SDD die 530 is mounted close to column axis 156 on the major surface 538 of insulating layer 534. Major surface 538 is the major surface of insulating layer 534 facing sample holder 140. The SDD die can be mounted on major surface 538 using a conventional die mounting technique commonly used in the semiconductor industry. Mounting SDD die 530 on layered electron beam column 502 facing sample holder 140 enables silicon drift detector 532 to receive the higher intensity of x-rays that are emitted at relatively small angles relative to column axis 156.

Figure 7B:
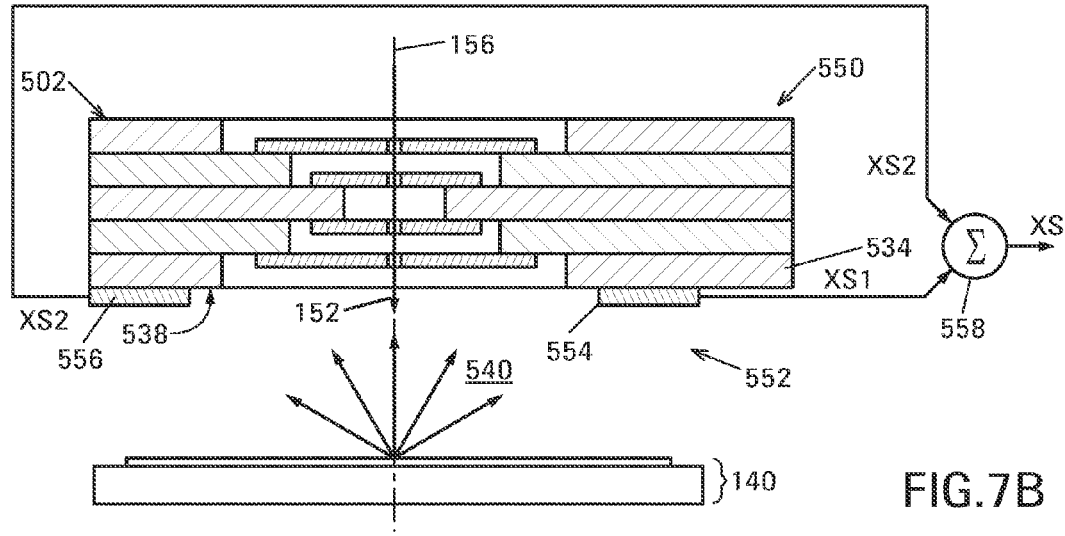

FIG. 7B shows another example 550 of an x-ray generation and detection system composed of layered electron beam column 502, described above with reference to FIG. 7A, and an integrated x-ray detector 552. Elements of x-ray generation and detection system 550 that correspond to elements of x-ray generation and detection system 500 described above with reference to FIG. 7A are indicated using the same reference numerals and will not be described again in detail. In the example of x-ray generation and detection system 550 shown, integrated x-ray detector 552 includes an SDD die 554, an SDD die 556, and a summing circuit 558. SDD die 554 and SDD die 556 are mounted on the insulating layer 534 of layered electron beam column 502 closest to sample holder 140. Specifically, SDD dies 554, 556 are mounted on the major surface 538 of insulating layer 534 close to column axis 156 and on opposite sides thereof. Major surface 538 is the major surface of insulating layer 534 facing sample holder 140.

SDD dies 554, 556 are each similar to SDD die 530 described above with reference to FIG. 7A. Each SDD die 554, 556 has a respective x-ray detection signal output electrically connected to a respective input of summing circuit 558. Summing circuit 558 additionally has an output. In response to x-rays 540 incident thereon each SDD die 554, 556 generates a respective x-ray detection signal component XS1, XS2. Summing circuit 558 sums x-ray detection signal components XS1, XS2 to generate x-ray detection signal XS having a higher signal-to-noise ratio than either of the x-ray detection signal components.

In other examples of x-ray generation and detection system 550, integrated x-ray detector 552 includes one or more additional SDD dies (not shown) mounted on major surface 538 around column axis 156, and summing circuit 558 has a corresponding number of inputs. The respective x-ray detection signal components generated by the one or more additional SDD dies, when summed, further increase the signal-to-noise ratio of x-ray detection signal XS.

Figure 7C:
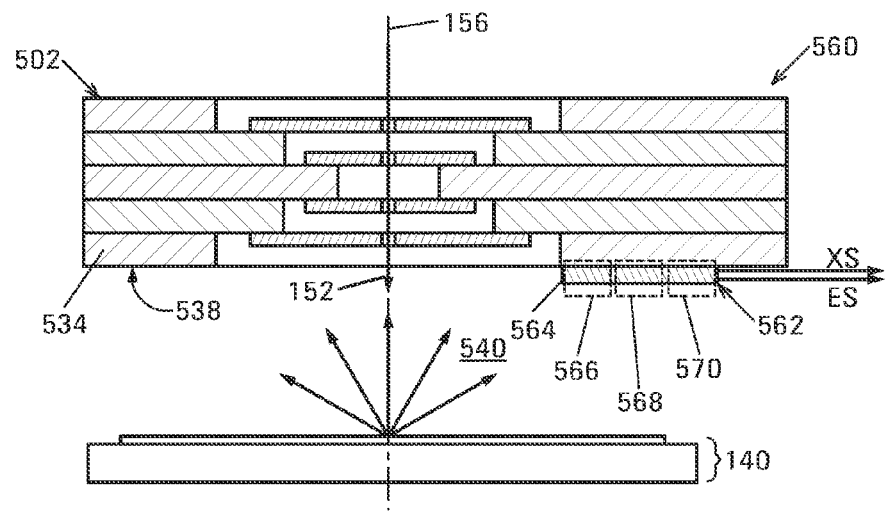

FIG. 7C shows another example 560 of an x-ray generation and detection system composed of layered electron beam column 502, described above with reference to FIG. 7A, and an integrated x-ray and electron detector 562. Elements of x-ray generation and detection system 560 that correspond to elements of x-ray generation and detection system 500 described above with reference to FIG. 7A are indicated using the same reference numerals and will not be described again in detail. In the example of x-ray generation and detection system 560 shown, integrated x-ray and electron detector 562 includes the x-ray detector 120 and the electron detector 170 of spectroscopy apparatus 100 described above with reference to FIG. 1 implemented on the same multi-detector die. X-ray and electron detector 562 includes a multi-detector die 564 in and on which are fabricated an x-ray detector 566, an electron detector 568 and integrated amplifying electronics 570. In an example, x-ray detector 566 is a silicon drift detector. Other types of x-ray detectors are known and may be included in integrated x-ray and electron detector 562. In an example, electron detector 568 includes a silicon photodiode. Other types of electron detector are known and may be included in integrated x-ray and electron detector 562. Alternatively, the silicon drift detector used as x-ray detector 566 may additionally serve as electron detector 568. Multi-detector die 564 is mounted on the insulating layer 534 of layered electron beam column 502 closest to sample holder 140 in a manner similar to SDD die 530, described above.

When SEM 110 operates in SEM mode, electron detector 568 generates an electron detection signal in response to backscattered electrons and secondary electrons stimulated by electron beam 152 and incident thereon. Amplifying electronics 570 amplify the electron detection signal generated by electron detector 568 to generate a robust electron detection signal ES for output to controller 190 (FIG. 1). When SEM 110 operates in EDM mode, x-ray detector 566 generates an x-ray detection signal in response to x-rays 540 incident thereon. Amplifying electronics 570 amplify the x-ray detection signal generated by x-ray detector 566 to generate a robust x-ray detection signal XS for output to controller 190.

In other examples of x-ray generation and detection system 560, integrated x-ray and electron detector 562 includes one or more additional multi-detector dies (not shown) mounted on major surface 538 around column axis 156. Each of the multi-detector dies is similar to multi-detector die 564. The integrated x-ray and electron detector additionally includes respective summing circuits to sum the electron detection signals and the x-ray detection signals generated by all the multi-detector dies to generate electron detection signal ES and x-ray detection signal XS each having a higher signal-to-noise ratio than the electron detection signals and the x-ray detection signals respectively generated by the individual multi-detector dies. Some embodiments have x-ray-only and/or electron-only detector dies mounted on major surface 538 in addition to multi-detector dies.

Figure 7D:
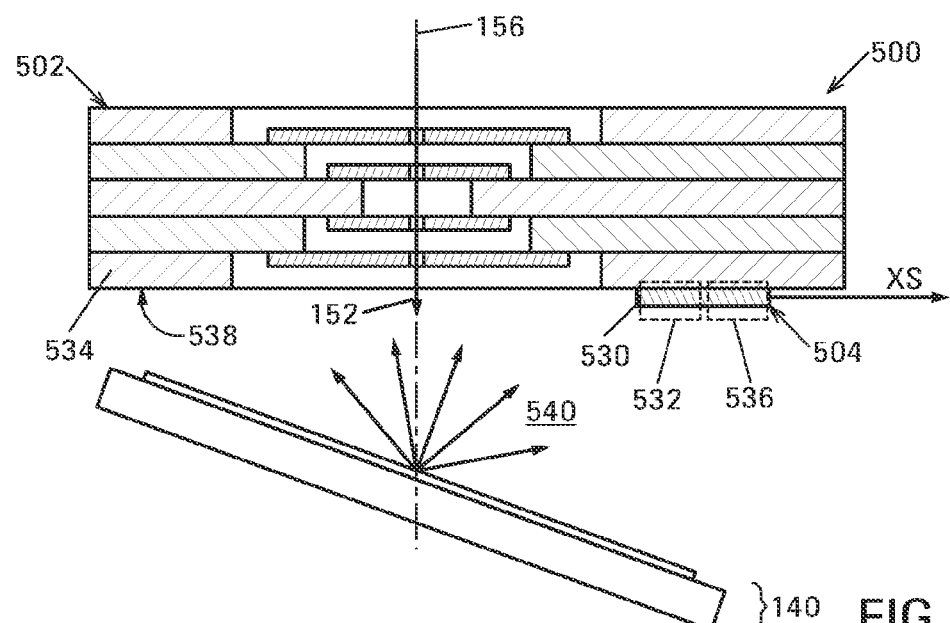
FIG. 7D is a cross-sectional view showing the x-ray generation and detection system shown in FIG. 7A operating with a tilted sample holder.

FIG. 7D is a cross-sectional view showing the operation of x-ray generation and detection system 500, described above with reference to FIG. 7A, with sample holder 140 tilted such that electron beam 152 is incident on its surface at a non-zero angle of incidence relative to the normal to the surface. In an example, an implementation of positioning stage 220 described above with reference to FIGS. 3A-3D having a tilting capability is used to tilt the sample holder. Tilting the sample holder enables silicon drift detector 532 on SDD die 530 to receive the higher-intensity x-rays emitted at small angles relative to the normal, which can increase the signal-to-noise ratio of x-ray detection signal XS. The x-ray generation and detection systems described above with reference to FIGS. 7B and 7C and to be described below with reference to FIGS. 8 and 9 can also be operated with sample holder 140 tilted.

Figure 8:
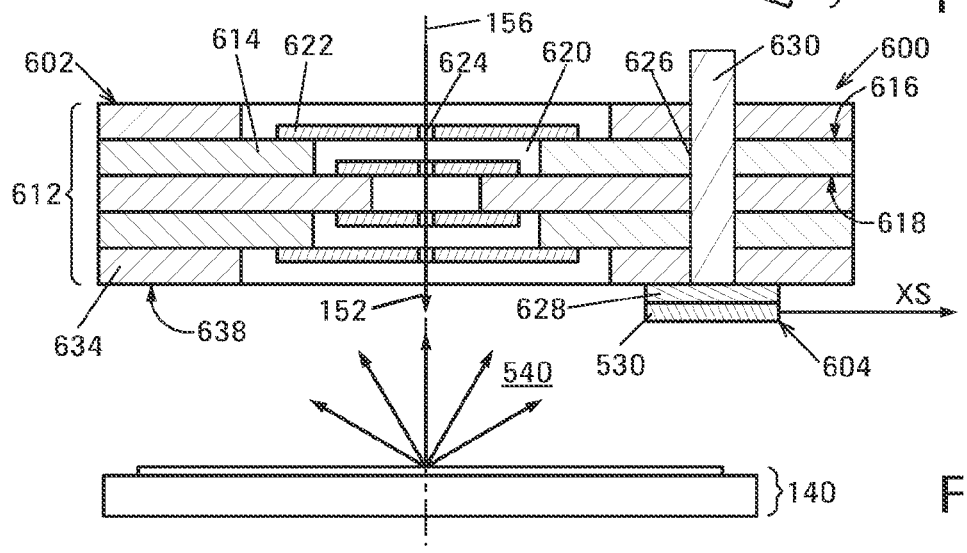

Locating the x-ray detector on a surface of layered electron beam column 502 facing sample holder 140, as shown in FIGS. 7A-7D, generates x-ray detection signal XS with a higher signal-to-noise ratio than a similar x-ray detector located further from column axis 156. FIG. 8 shows another example 600 of an x-ray generation and detection system composed of a layered electron beam column 602 having an integrated cooled x-ray detector 604. X-ray generation and detection system 600 is suitable for use in applications in which a further increase in the signal-to-noise ratio of x-ray detection signal XS is needed. Elements of system 600 that correspond to elements of system 500 described above with reference to FIG. 7A are indicated using the same reference numerals with 100 added. In the example shown in FIG. 8, layered electron beam column 602 includes a stack 612 of insulating layers. An exemplary insulating layer is shown at 614. Reference numeral 614 will additionally be used to refer to insulating layers in general. Insulating layers 614 are similar to insulating layers 514 described above with reference to FIG. 7A, but each additionally includes a heat-pipe bore 626 extending between major surfaces 616 and 618 at a location laterally offset from electron path 624. Insulating layers 614 are stacked with the respective electron paths of their functional elements 622 centered on column axis 156, and with heat-pipe bores 626 arranged coaxially.

Integrated cooled x-ray detector 604 includes an x-ray detector thermally coupled to a cooling system. In the example shown, the x-ray detector includes silicon drift detector (SDD) die 530, and the cooling system includes a thermoelectric cooler 628, such as a Peltier cooler, and a heat pipe 630. SDD die 530 is mounted on the cold surface of thermoelectric cooler 628, and heat pipe 630 is thermally coupled to the hot surface of the thermoelectric cooler, opposite the cold surface. Thermoelectric cooler 628 with SDD die 530 mounted thereon is mounted on the insulating layer 634 of layered electron beam column 602 closest to sample holder 140 with heat pipe 630 extending through heat-pipe bore 626 to an external heat sink (not shown). Specifically, thermoelectric cooler 628 with SDD die 530 mounted thereon is mounted close to column axis 156 on the major surface 638 of insulating layer 634. Major surface 638 is the major surface of insulating layer 634 facing sample holder 140. Mounting SDD die 530 on layered electron beam column 602 acing sample holder 140 enables the silicon drift detector 532 on SDD die 530 to receive the higher-intensity x-rays that are emitted at relatively small angles relative to column axis 156. Supplying electric current to thermoelectric cooler 628 extracts heat from SDD die 530 to improve the signal-to-noise ratio of x-ray detection signal XS.

In other examples of x-ray generation and detection system 600, integrated cooled x-ray detector 604 includes one or more additional SDD dies mounted on major surface 686 around column axis 156. Each of the SDD dies is similar to SDD die 530. In some examples, each additional SDD die is thermally coupled to its own cooling system. In other examples, all the SDD dies, or a subset of the SDD dies, share a common cooling system. A summing circuit, similar to summing circuit 558 described above with reference to FIG. 7B, sums the x-ray detection signal components generated by the SDD dies to generate an x-ray detection signal XS with a higher signal-to-noise ratio than the x-ray detection signal components. A multi-detector die on which are integrated an x-ray detector and an electron detector, as described above with reference to FIG. 7C, may be substituted for SDD die 530 and/or any of the additional SDD dies.

Figure 9:
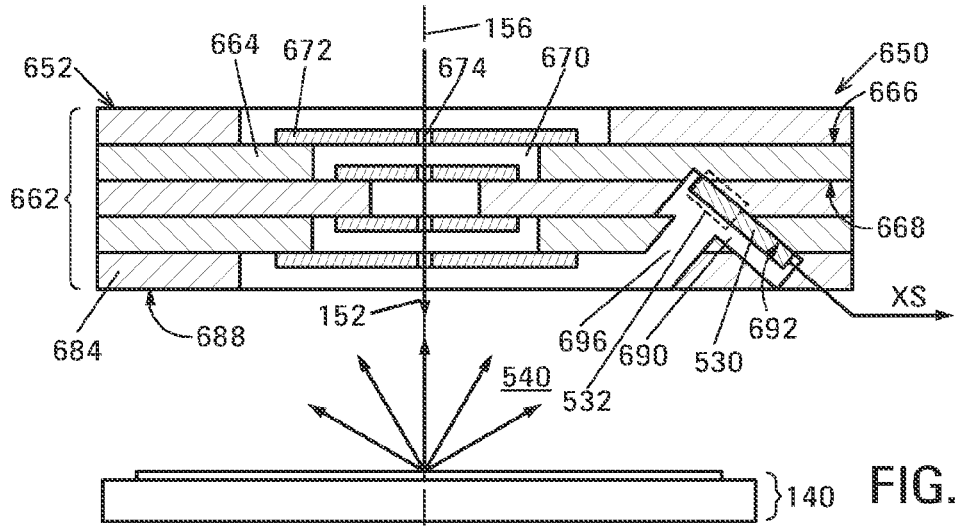

Another way to increase the signal-to-noise ratio of x-ray detection signal XS as is to tilt SDD die 530 such that x-rays 540 are incident on silicon drift detector 532 at a small angle of incidence relative to the normal to the surface of the die. FIG. 9 is a cross-sectional view another example 650 of an x-ray generation and detection system composed of a layered electron beam column 65 having an integrated x-ray detector 654 suitable for use in applications in which a further increase in the signal-to-noise ratio of the x-ray detection signal XS is needed. Elements of system 650 that correspond to elements of system 500 described above with reference to FIG. 7A are indicated using the same reference numerals with 150 added. In the example shown, layered electron beam column 652 includes a stack 662 of insulating layers. An exemplary insulating layer is shown at 664. Reference numeral 664 will additionally be used to refer to insulating layers in general. Insulating layers 664 are similar to insulating layers 514 described above with reference to FIG. 7A, but respective portions of at some of the insulating layers 664 are removed (or are not initially formed) to define a cuboidal or cylindrical detector mounting chamber 690 that includes a substantially planar detector mounting surface 692. Insulating layer 684 is the insulating layer closest to sample holder 140. Detector mounting surface 692 is inclined relative to the major surface 688 of insulating layer 684 and is oriented such that a normal to the mounting surface and column axis 156 intersect at sample holder 140 at the nominal working distance of sample holder 140 from layered electron beam column 652. SDD die 530 is mounted on inclined detector mounting surface 692 using a conventional die mounting technique. The removed or not initially formed portions of insulating layers 664 additionally define a cylindrical or cuboidal passageway 696 extending normally to detector mounting surface 692 from major surface 688 to a region of detector mounting chamber 690 aligned with the silicon drift detector 532 of SDD die 530. Mounting SDD die 530 on inclined detector mounting surface 692 within detector mounting chamber 690 enables silicon drift detector 532 to receive the higher-intensity x-rays 540 that are emitted at relatively small angles relative to column axis 156 at a substantially normal angle of incidence at which reflection at the surface of the detector is minimized. In some embodiments, a thermoelectric cooler, similar to that described above with reference to FIG. 8, is interposed between SDD die 530 and detector mounting surface 692.

In other examples of x-ray generation and detection system 650, insulating layers 664 are shaped to define one or more additional detector mounting chambers and respective passageways around column axis 156. The detector mounting chambers and respective chambers are similar to detector mounting chamber 690 and passageway 696, respectively. In such examples, integrated x-ray and electron detection system 650 additionally includes a respective SDD die mounted on the detector mounting surface of each additional detector mounting chamber. Each of the SDD dies is similar to SDD die 530. A summing circuit, similar to summing circuit 558 described above with reference to FIG. 7B, sums the x-ray detection signal components generated by the SDD dies to generate x-ray detection signal XS with a higher signal-to-noise ratio than the x-ray detection signal components. A multi-detector die on which are integrated an x-ray detector and an electron detector, as described above with reference to FIG. 7C, may be substituted for SDD die 530 and/or any of the additional SDD dies.

This disclosure describes the invention in detail using illustrative embodiments. However, the invention defined by the appended claims is not limited to the precise embodiments described.

We claim:

1. A scanning electron microscopy (SEM) an energy dispersive spectroscopy (EDS) apparatus, comprising:
   a scanning electron microscope comprising a sample holder, undo layered electron beam column arranged to output an electron beam towards the sample holder at an initial beam energy;
   an x-ray detector; and
   an auxiliary acceleration voltage source to apply an auxiliary acceleration voltage between the sample holder and the layered electron beam column to accelerate the electron beam to a final beam energy, the electron beam at the final beam energy capable of generating x-rays at multiple wavelengths from a larger range of atomic species than the electron beam at the initial beam energy.

2. The spectroscopy apparatus of claim 1, in which the x-ray detector comprises a silicon drift detector.

3. The spectroscopy apparatus of claim 2, in which the silicon drift detector is part of a silicon drift detector die mounted on the layered electron beam column.

4. The spectroscopy apparatus of claim 3, in which the silicon drift detector die is mounted on a surface of the layered electron beam column facing the sample holder.

5. The spectroscopy apparatus of claim 3, in which:
   the layered electron beam column comprises a detector mounting chamber defined therein, the detector mounting chamber comprising an inclined detector mounting surface; and
   the silicon drift detector die is mounted on the inclined detector mounting surface.

6. The spectroscopy apparatus of claim 5, in which:
   the layered electron beam column comprises one or more additional inclined detector mounting surfaces defined therein; and
   the spectroscopy apparatus additionally comprises:
      a respective additional silicon drift detector die mounted on each of the additional inclined detector mounting surfaces, and
      a summing circuit to sum x-ray detection signal components generated by the silicon drift detector dies to generate an x-ray detection signal having a higher signal-to-noise ratio than the x-ray detection signal components.

7. The spectroscopy apparatus of claim 3, additionally comprising:
   additional silicon drift detector dies mounted on the surface of the layered electron beam column facing the sample holder; and
   a summing circuit to sum x-ray detection signal components generated by the silicon drift detector dies to generate an x-ray detection signal having a higher signal-to-noise ratio than the x-ray detection signal components.

8. The spectroscopy apparatus of claim 2, in which the silicon drift detector and a silicon photodiode electron detector are integrated on a common multi-detector die mounted on a surface of the layered electron beam column facing the sample holder.

9. The spectroscopy apparatus of claim 2, in which:
   the silicon drift detector and a silicon photodiode electron detector are integrated on a common multi-detector die; and
   the layered electron beam column comprises a detector mounting chamber defined therein, the detector mounting chamber comprising an inclined detector mounting surface on which the multi-detector die is mounted.

10. The spectroscopy apparatus of claim 2, in which:
    the x-ray detector additionally comprises thermoelectric cooler comprising a cold face; and
    the silicon drift detector is mounted on the cold face of the thermoelectric cooler.

11. The spectroscopy apparatus of claim 2, in which the x-ray detector additionally comprises an amplifier electrically connected to the silicon drift detector.

12. The spectroscopy apparatus of claim 1, in which the auxiliary acceleration voltage source sets the sample holder to a voltage more positive than the layered electron beam column.

13. The spectroscopy apparatus of claim 1, in which the auxiliary acceleration voltage source comprises a high-voltage power supply.

14. The spectroscopy apparatus of claim 1, in which the auxiliary acceleration voltage source comprises an electrical connector to receive the auxiliary acceleration voltage from an external high-voltage power supply.

15. The spectroscopy apparatus of claim 1, additionally comprising a controller to correct x-ray image distortion resulting from the auxiliary acceleration voltage.

16. The spectroscopy apparatus of claim 1, additionally comprising an electrical connector in series between the auxiliary acceleration voltage source and the sample holder, the electrical connector automatically disconnecting upon removal of the sample holder from the spectroscopy apparatus.

17. The spectroscopy apparatus of claim 1, in which:
the auxiliary acceleration voltage is additionally to dive electrons away from the x-ray detector; and
the x-ray detector lacks an electron trap.

18. A scanning electron microscopy (SEM) and energy dispersive spectroscopy (EDS) apparatus, comprising:
a scanning electron microscope comprising a sample holder, and an electron beam column arranged to output an electron beam towards the sample holder, the electron beam column subject to a voltage limitation that limits the electron beam to an initial beam energy incapable of generating x-rays at multiple wavelengths from atomic species having atomic numbers greater than a threshold atomic number;
an x-ray detector; and
an auxiliary acceleration voltage source to apply an auxiliary acceleration voltage between the sample holder and the electron beam column to accelerate the electron beam to a final beam energy, the electron beam at the final beam energy capable of generating x-rays at multiple wavelengths from atomic species having atomic numbers greater than the threshold atomic number.

19. The spectroscopy apparatus of claim 18, in which the x-ray detector comprises a silicon drift detector die mounted on the electron beam column, the silicon drift detector die comprising a silicon drift detector.

20. The spectroscopy apparatus of claim 18, in which the x-ray detector comprises a multi-detector die mounted on the electron beam column, the multi-detector die comprising a silicon drift detector and additionally comprising an electron detector.

* * * * *